United States Patent [19]

Fergus

[11] Patent Number: 5,327,099
[45] Date of Patent: Jul. 5, 1994

[54] DIFFERENTIAL STAGE THAT PROVIDES MINIMAL OFFSET BETWEEN INPUTS

[75] Inventor: George H. Fergus, Schaumburg, Ill.

[73] Assignee: Motorola, Inc., Schaumburg, Ill.

[21] Appl. No.: 100,223

[22] Filed: Aug. 2, 1993

[51] Int. Cl.$^5$ .......................... H03F 3/45; H03G 3/10
[52] U.S. Cl. ...................................... 330/254; 330/252; 330/9; 307/493; 307/494
[58] Field of Search ........................... 330/252, 254, 9; 307/493, 494

[56] References Cited

U.S. PATENT DOCUMENTS 4,868,517 9/1989 Waldhauer et al. ................ 330/254

OTHER PUBLICATIONS

A Monolithic Analog Compandor, Craig C. Todd IEEE Journal of Solid-State Circuits, vol. SC-11, No. 6, Dec. 1976.

*Primary Examiner*—William L. Sikes
*Assistant Examiner*—Fetsum Abraham
*Attorney, Agent, or Firm*—Timothy W. Markison

[57] ABSTRACT

A differential stage that provides minimal offset between its differential inputs includes first and second transistor sets and first and second buffering elements. Each transistor of the first and second transistor sets includes an input terminal, a common terminal, and an output terminal. The differential inputs are provided by the input terminals of the transistors in the second transistor set via the second buffering element. An output of the differential stage is provided by the coupling between the first and second buffering elements.

18 Claims, 1 Drawing Sheet

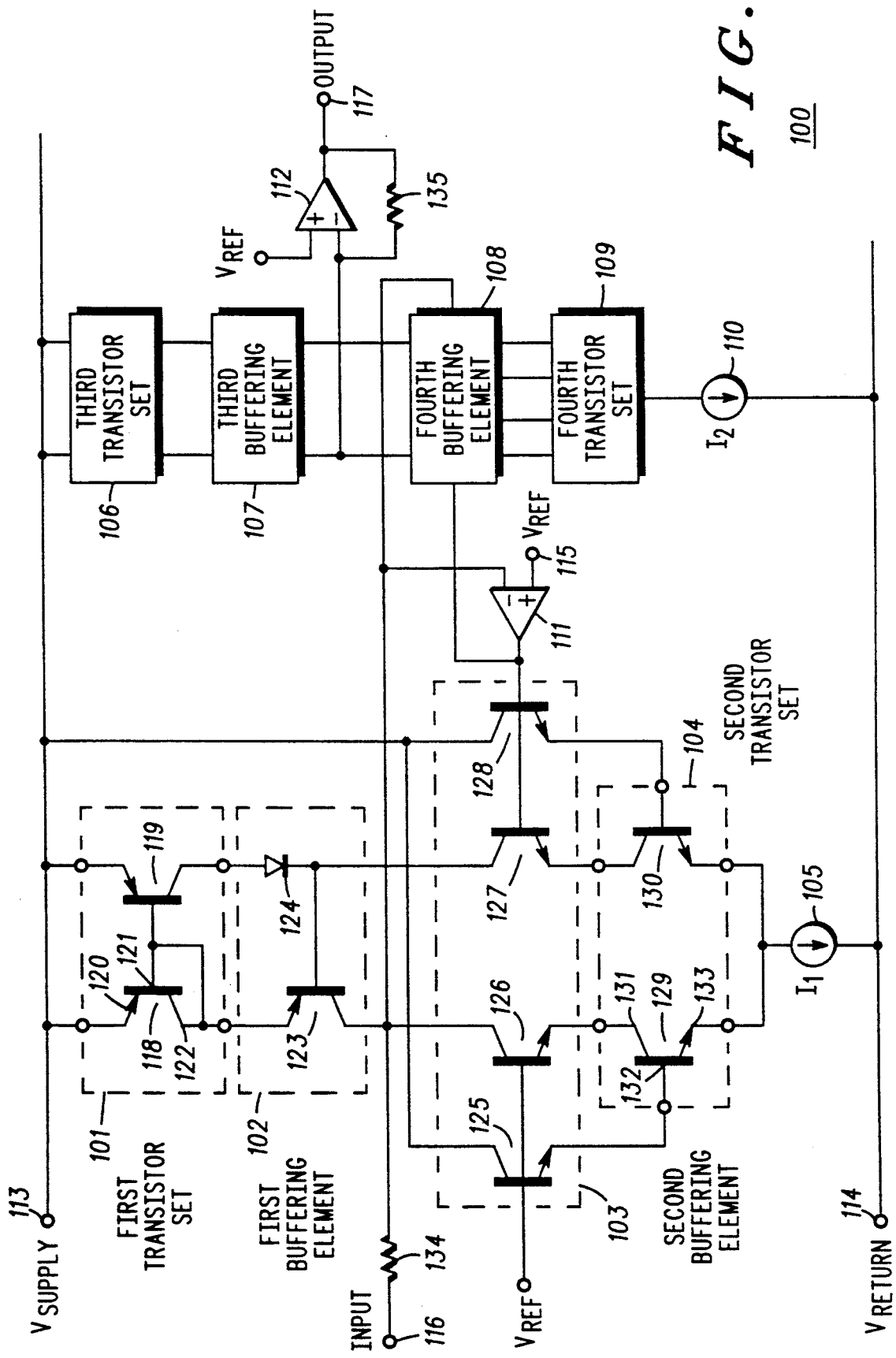

DIFFERENTIAL STAGE THAT PROVIDES MINIMAL OFFSET BETWEEN INPUTS

FIELD OF THE INVENTION

This invention relates generally to differential amplifiers and, in particular, to a differential amplifier stage that provides minimal offset voltage between its differential inputs.

BACKGROUND OF THE INVENTION

Differential amplifiers are known to include a pair of amplifying transistors that receive their respective DC bias currents from a DC power supply via matched biasing circuits and are controlled by a DC current source located between the common node of the pair of amplifying transistors and a return of the DC power supply. AC input signals that are provided to an input terminal of each amplifying transistor are amplified by the differential amplifier such that an output signal proportional to the difference of the AC input signals is provided at the differential amplifier's output. Operation of the differential amplifier is well known; thus, no further discussion will be presented.

Differential amplifier stages are extensively utilized as the input amplifier in various operational amplifiers, but are often also incorporated in analog multipliers. As is known, analog multipliers provided multiplication of an input AC voltage or current. Multipliers generally include a pair of differential amplifier stages which receive their respective DC bias currents via matched current mirrors and are controlled by independent DC current sources. An operational amplifier is typically employed in the analog multiplier to provide simultaneous control of the pair of differential amplifier stages which subsequently results in multiplication of the input current with the DC currents provided by the current sources. To produce voltage multiplication, an input voltage is provided to the input of a current multiplier via a resistor that converts the input voltage to an input current. The input current is multiplied by the current multiplier and delivered to the output of the multiplier. The output current is subsequently reconverted back to a voltage via an output operational amplifier to effectively produce voltage multiplication of the input voltage.

Ideally, differential amplifiers provide no output voltage, or current, when either no input voltages are applied or both input voltages have substantially identical magnitudes. However, since both transistors do not typically have identical DC current versus voltage characteristics, an offset DC voltage appears at the output of the differential amplifier without any differential input voltage applied. The offset voltage typically varies with power supply voltage changes and ambient temperature excursions depending on the characteristics of each transistor. Thus, since operational amplifiers and voltage multipliers employ differential amplifiers for gain control fluctuations in the offset voltage results in corresponding undesired fluctuations in the gain of the operational amplifiers and voltage multipliers that incorporate the differential amplifiers.

To reduce the offset voltage, prior art methodology applies an external secondary offset voltage to the differential amplifier in an attempt to counteract the effects of the internal offset voltage produced by the transistor characteristics. However, this secondary offset voltage must be accordingly adjusted for each pair of transistors and requires temperature compensation and a constant power supply voltage.

Therefore, a need exists for a differential amplifier that provides minimal offset between its differential inputs while being substantially invariant to temperature and power supply voltage variations and eliminates the need for an external secondary offset voltage.

BRIEF DESCRIPTION OF THE DRAWINGS

FIG. 1 illustrates a voltage multiplier in accordance with the present invention.

DESCRIPTION OF A PREFERRED EMBODIMENT

FIG. 1 illustrates a voltage multiplier 100 that includes input and output differential stages and first and second operational amplifiers 111 and 112. The input differential stage is powered by a DC supply voltage 113 and includes a first transistor set 101, a first buffering element 102, a second buffering element 103, a second transistor set 104, and an electronically adjustable DC current source 105. Similarly, the output differential stage is powered by the DC supply voltage 113 and includes a third transistor set 106, a third buffering element 107, a fourth buffering element 108, a fourth transistor set 109, and an electronically adjustable DC current source 110. Generally, the output differential stage is substantially identical to the input differential stage. That is, the third transistor set 106 is substantially identical to the first transistor set 101, the third buffering element 107 is substantially identical to the first buffering element 102, the fourth buffering element 108 is substantially identical to the second buffering element 103, and the fourth transistor set 109 is substantially identical to the second transistor set 104.

The voltage multiplier 100 further includes a variety of active components within its multitude of functional blocks. The first and third transistor sets 101 and 106 typically comprise a pair of PNP bipolar junction transistors (BJTs) 118 and 119 configured as current mirrors. The first and third transistor sets 101 and 106 may also comprise NPN BJTs or various other transistor types, such as field-effect transistors (FETs), configured as current mirrors or independent current sources that supply one half the current provided by their respective DC current sources 105 and 110. Each PNP transistor in the first and third transistor sets 101 and 106 is a three terminal device that includes an input terminal 121, or base, a common terminal 120, or emitter, and an output terminal 122, or collector. The second and fourth transistor sets 104 and 109 typically comprise a pair of NPN BJTs 129 and 130. The second and fourth transistor sets 104 and 109 may also comprise PNP BJTs or FETs. Each transistor in the second and fourth transistor sets 104 and 109 is a three terminal device that includes an input terminal 132, or base, a common terminal 133, or emitter, and an output terminal 131, or collector. Each pair of transistors 129 and 130 in the second and fourth transistor sets 104 and 109 is configured as a differential amplifier. Thus, the common terminals 133 of each transistor pair are coupled together and supplied by their respective DC current sources 105 and 110. Although all four transistor sets 101, 104, 106, and 109 are described above to include only a pair of transistors in this embodiment, each transistor set may also include additional transistors depending on implementation.

The first and third buffering elements 102 and 107 include at least one current buffering transistor 123, such as a PNP BJT, and are connected to one output of their corresponding first and third transistor sets 101 and 106. In addition, the first and third buffering elements 102 and 107 may also include a bias voltage equalizing element, such as a diode 124, that is connected to another output of the first and third transistor sets 101 and 106. The second and fourth buffering elements 103 and 108 preferably include at least two current buffering transistors 126 and 127, such as common base NPN BJTs. The current buffering transistors 126 and 127 are connected to corresponding outputs of the second and fourth transistors sets 103 and 108 and outputs of the first buffering element 102. In addition, the second and fourth buffering elements 103 and 108 may also include at least two input buffering, level shifting transistors 125 and 128, such as emitter follower NPN BJTs. The input buffering, level shifting transistors 125 and 128 are connected to corresponding inputs of the second and fourth transistor sets 103 and 108. The first and second operational amplifiers 111 and 112 may be complex devices such as a standard 741-type operational amplifiers or simple differential amplifiers.

The differential inputs and outputs of the input and output differential stages are provided by interconnections and elements of the four buffering elements 102, 103, 107, and 108, and the second and fourth transistor sets 104 and 109. The differential inputs of the input differential stage are provided by the input terminals 132 of the pair of transistors 129 and 130 in the second transistor set 104, via the second buffering element 103. Thus, input voltages to the input differential amplifier are actually applied to the bases of the input buffering, level shifting transistors 125 and 128. The output of the input differential stage is provided by the interconnection, or coupling, between the first buffering element 102 and the second buffering element 103. Similarly, the differential inputs of the output differential stage are provided by the input terminals of the pair of transistors in the fourth transistor set 109, via the fourth buffering element 108, and the output of the output differential stage is provided by the interconnection between the third buffering element 107 and the fourth buffering element 108.

With the above described interconnections, the voltage multiplier 100 provides multiplication of an AC voltage present at its input 116 by multiplying the AC input voltage by a ratio of the currents produced by the electronically adjustable current sources 105 and 110 and a ratio of the impedances provided by a feedback device 135, such as a feedback resistor, and an input linear device 134, such as a resistor. The input voltage is converted to a current via the input linear device 134, and the current is supplied to the inverting input of the first operational amplifier 111. The noninverting input of the first operational amplifier 111 is supplied with a reference voltage ($V_{REF}$) 115. The first operational amplifier 111 and the input differential stage comprise a feedback loop which stabilizes the DC voltage to the reference voltage 115 at the base of the first input buffering, level shifting transistor 125 and causes an AC voltage to appear at the base of the second input buffering, level shifting transistor 128. Because of the exponential characteristics of the pair of NPN BJTs 129 and 130 in the second transistor set 104, the AC voltage is proportional to the logarithm of the input AC voltage divided by the impedance of the input linear device 134 and the DC current provided by the input differential stage's current source 105. This logarithmic AC voltage is subsequently applied to a differential input of the fourth transistor set 109, via the fourth buffering element 108, which converts this logarithmic voltage to an output current that is proportional to the DC current provided by the output differential stage's current source 110. The output current is applied to the inverting input of the second operational amplifier 112 where it is converted to a voltage and provided to the voltage multiplier's output 117. Alternatively, the voltage multiplier 100 may be converted to a current multiplier by eliminating the second operational amplifier 112 and providing the output current directly to the voltage multiplier's output 117. In this case, the output current provided by the current multiplier is proportional to the ratio of the DC currents produced by the electronically adjustable current sources 105 and 110.

Since each pair of transistors in the four transistor sets 101, 104, 106, and 109 do not have matched current versus voltage characteristics, a DC offset voltage may be produced at the output of each differential stage and, consequently, at the output 117 of the voltage multiplier 100. With prior art techniques, the output terminals of each of the transistors in the four transistors sets 101, 104, 106, and 109 are operated at different DC voltages which correspondingly produces an inherent mismatch in the current versus voltage performance of each pair of transistors. This mismatch causes a DC offset voltage that varies according to changes in temperature and power supply voltage 113 based on the characteristics of the particular transistors used. To eliminate this offset, prior art methods apply an external counteractive offset voltage, or current, to each differential stage to overcome the DC offset produced by each differential stage. However, the magnitude of the counteractive offset voltage must be adjusted for each set of transistors and requires that the temperature and power supply voltages remain constant.

Since the voltage multiplier 100 is typically used as a gain control device, a DC offset voltage is highly undesirable. For example, when a voltage multiplier 100 is used in a known compandor circuit, it is typically followed by a voltage rectifier circuit which converts the voltage multiplier's AC output voltage to a DC voltage. Thus, any unpredictable DC offset voltage would be indistinguishable from the desired AC signal and would result in errant DC voltages at the output of the rectifier.

In the voltage multiplier 100 of the present invention, the first and second buffering elements 102 and 103 buffer the first and second transistor sets 101 and 104 from variation in ambient temperature and power supply voltage 113 while insuring a minimal differential offset voltage between inputs of the input differential stage. The differential offset voltage is minimized by providing one substantially identical voltage at the output terminals 131, or collectors, of the pair of transistors 129 and 130 in the second transistor set 104 and a second substantially identical voltage at the collectors of the pair of transistors 118 and 119 in the first transistor set 101. Since the current flowing through each half of the input differential stage is constant and equal, the collector voltage of each transistor correspondingly stabilizes the base voltage of each transistor. Therefore, the differential offset voltage (i.e. the voltage difference between the input terminals 132, or bases, of the pair of transistors 128 and 130 in the second transistor set 104)

is minimized since the base voltage of each transistor in the second transistor set 104 is substantially identical. By stabilizing the voltage at the output terminals of each transistor in the first and second transistor sets 101 and 104, the first and second buffering elements 102 and 103 allow the output current of each transistor to remain unchanged during variations of supply voltage 113 and temperature. In a similar manner, the third and fourth buffering elements 107 and 108 buffer the third and fourth transistor sets 106 and 109 while insuring a minimal differential offset voltage between inputs of the output differential stage.

The present invention provides a differential amplifier, which is typically utilized in a voltage multiplier, that provides minimal offset between its differential inputs. With this invention, an external counteractive offset voltage is not necessary to minimize the DC offset voltage produced at the differential amplifier's output due to variation in transistor characteristics. Further, the present invention overcomes the delinquencies of the prior art by insuring a minimal DC offset voltage over excursions of ambient temperature and power supply voltage. Still further, the present invention eliminates the need to make any compensatory adjustments to the voltage multiplier in order to accommodate each implementation.

I claim:

1. A differential stage that provides minimal offset between differential inputs, the differential stage comprises:
    a first transistor set, wherein each transistor of the first transistor set includes an input terminal, a common terminal, and an output terminal, wherein the input terminals are operably coupled together, and wherein the common terminals are operably coupled together;
    a first buffering element that is operably coupled to at least one output terminal of the first transistor set;
    a second transistor set, wherein each transistor of the second transistor set includes an input terminal, a common terminal, and an output terminal, wherein the common terminals are operably coupled together; and
    a second buffering element that is operably coupled to the first buffering element and to the output terminals of the second transistor set, wherein the input terminals of the second transistor set provide, via the second buffering element, the differential inputs, and wherein the coupling between the second buffering element and the first buffering element provides an output of the differential stage.

2. In the differential stage of claim 1, the first buffering element is operably coupled to both output terminals of the first transistor set.

3. In the differential stage of claim 1, the first buffering element includes a transistor.

4. In the differential stage of claim 3, the first buffering element further includes a diode.

5. In the differential stage of claim 1, the second buffering element comprises at least four transistors.

6. In the differential stage of claim 1, the first transistor set comprises a pair of PNP bipolar junction transistors and the second transistor set comprises a pair of NPN bipolar junction transistors.

7. In the differential stage of claim 1, the first transistor set comprise a pair of NPN bipolar junction transistors and the second transistor set comprises a pair of PNP bipolar junction transistors.

8. A voltage multiplier that provides multiplication of an input voltage, wherein the voltage multiplier includes an input differential stage and an output differential stage, wherein the input differential stage and the output differential stage provide minimal offset between differential inputs, the voltage multiplier comprises:
    a first transistor set, wherein each transistor of the first transistor set includes an input terminal, a common terminal, and an output terminal, wherein the input terminals are operably coupled together, and wherein the common terminals are operably coupled together;
    a first buffering element that is operably coupled to at least one output terminal of the first transistor set;
    a second transistor set, wherein each transistor of the second transistor set includes an input terminal, a common terminal, and an output terminal, wherein the common terminals are operably coupled together;
    a second buffering element that is operably coupled to the first buffering element and to the output terminals of the second transistor set, wherein the input terminals of the second transistor set provide, via the second buffering element, the differential inputs of the input differential stage, and wherein the coupling between the second buffering element and the first buffering element provides an output of the input differential stage;
    a third transistor set, wherein each transistor of the third transistor set includes an input terminal, a common terminal, and an output terminal, wherein the input terminals are operably coupled together, and wherein the common terminals are operably coupled together;
    a third buffering element that is operably coupled to at least one output terminal of the third transistor set;
    a fourth transistor set, wherein each transistor of the fourth transistor set includes an input terminal, a common terminal, and an output terminal, wherein the common terminals are operably coupled together;
    a fourth buffering element that is operably coupled to the third buffering element and to the output terminals of the fourth transistor set, wherein the input terminals of the fourth transistor set provide, via the fourth buffering element, the differential inputs of the output differential stage, and wherein the coupling between the fourth buffering element and the third buffering element provides an output of the output differential stage;
    a first operational amplifier, wherein the input voltage is supplied to an inverting input of the first operational amplifier, wherein the inverting input of the first operational amplifier is operably coupled to the output of the input differential stage and to one of the differential inputs of the output differential stage, a noninverting input of the first operational amplifier is operably coupled to a reference voltage, and an output of the first operational amplifier is operably coupled to one of the differential inputs of the input differential stage and to one of the differential inputs of the output differential stage; and
    a second operational amplifier, wherein an inverting input of the second operational amplifier is operably coupled to the output of the output differential stage, a noninverting input of the second operational amplifier is operably coupled to the reference voltage, and an output of the second operational amplifier provides an output of the voltage multiplier.

9. In the voltage multiplier of claim 8, the first buffering element is operably coupled to both output terminals of the first transistor set.

10. In the voltage multiplier of claim 8, the third buffering element is operably coupled to both output terminals of the third transistor set.

11. In the voltage multiplier of claim 8, the first buffering element includes a transistor.

12. In the voltage multiplier of claim 11, the first buffering element further includes a diode.

13. In the voltage multiplier of claim 8, the third buffering element includes a transistor.

14. In the voltage multiplier of claim 13, the third buffering element further includes a diode.

15. In the voltage multiplier of claim 8, the second buffering element comprises at least four transistors.

16. In the voltage multiplier of claim 8, the fourth buffering element comprises at least four transistors.

17. In the voltage multiplier of claim 8, the first transistor set and the third transistor set each comprises a pair of PNP bipolar junction transistors and the second transistor set and the fourth transistor set each comprises a pair of NPN bipolar junction transistors.

18. In the voltage multiplier of claim 8, the first transistor set and the third transistor set each comprises a pair of NPN bipolar junction transistors and the second transistor set and the fourth transistor set each comprises a pair of PNP bipolar junction transistors.

* * * * *